(12) United States Patent
Sato et al.

(10) Patent No.: US 7,803,502 B2
(45) Date of Patent: Sep. 28, 2010

(54) PHOTOMASK AND METHOD OF MANUFACTURING SEMICONDUCTOR DEVICE USING THE PHOTOMASK

(75) Inventors: Takashi Sato, Fujisawa (JP); Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

(21) Appl. No.: 11/819,104

(22) Filed: Jun. 25, 2007

(65) Prior Publication Data
US 2008/0008941 A1 Jan. 10, 2008

(30) Foreign Application Priority Data
Jun. 26, 2006 (JP) .............. 2006-175898

(51) Int. Cl.
*G03F 1/00* (2006.01)
(52) U.S. Cl. .......................... 430/5; 430/311
(58) Field of Classification Search .............. 430/5, 430/311, 22, 30; 438/128; 355/53; 356/401
See application file for complete search history.

(56) References Cited

U.S. PATENT DOCUMENTS

| 5,563,012 | A | | 10/1996 | Neisser |
| 5,879,844 | A | * | 3/1999 | Yamamoto et al. ............ 430/30 |
| 5,888,677 | A | * | 3/1999 | Nakae ............................ 430/5 |
| 6,495,297 | B1 | * | 12/2002 | Tu et al. ........................ 430/5 |
| 2003/0117627 | A1 | * | 6/2003 | Sato et al. .................... 356/401 |
| 2003/0148635 | A1 | * | 8/2003 | Hasegawa et al. ........... 438/942 |
| 2007/0134563 | A1 | | 6/2007 | Fukuhara et al. |

FOREIGN PATENT DOCUMENTS

| JP | 10-010700 | 1/1998 |
| JP | 10-133356 | 5/1998 |
| JP | 3750312 | 12/2005 |

\* cited by examiner

*Primary Examiner*—Mark F Huff
*Assistant Examiner*—Stewart A Fraser
(74) *Attorney, Agent, or Firm*—Finnegan, Henderson, Farabow, Garrett & Dunner, L.L.P.

(57) ABSTRACT

A photomask includes a mask substrate to be irradiated with irradiation light, and first and second phase shifters arranged on the mask substrate. The first phase shifter is arranged on the mask substrate with a first pitch not larger than eight times the wavelength of the irradiation light, has a transmittance of not more than 5% for the irradiation light, and phase-shifts the irradiation light by 180°. The second phase shifter is arranged on the mask substrate with a second pitch larger than eight times the wavelength, has a transmittance of not more than 5%, and phase-shifts the irradiation light by 180°.

17 Claims, 8 Drawing Sheets

PHOTOMASK AND METHOD OF MANUFACTURING SEMICONDUCTOR DEVICE USING THE PHOTOMASK

CROSS-REFERENCE TO RELATED APPLICATIONS

This application is based upon and claims the benefit of priority from prior Japanese Patent Application No. 2006-175898, filed Jun. 26, 2006, the entire contents of which are incorporated herein by reference.

BACKGROUND OF THE INVENTION

1. Field of the Invention

The present invention relates to an exposure technique and, more particularly, to a photomask and a method of manufacturing a semiconductor device using the photomask.

2. Description of the Related Art

In recent years, the feature sizes of semiconductor devices decrease, and the pitch of a mask pattern formed on a photomask also decreases. When the pitch of the mask pattern on the photomask becomes about 4 times or less the wavelength of irradiation light, the diffraction efficiency starts to change depending on the polarization direction of the irradiation light. The phenomenon in which the diffraction efficiency changes depending on the pitch of the mask pattern and the polarization direction is called a waveguide effect (for example, see Japanese Patent No. 3750312). When a waveguide effect occurs, the intensity of light transmitted through the photomask varies in accordance with the pitch of the mask pattern. This causes an error in the line width or the like of the projection image of the mask pattern.

BRIEF SUMMARY OF THE INVENTION

According to an aspect of the present invention, there is provided a photomask comprising a mask substrate to be irradiated with irradiation light, a first phase shifter which is arranged on the mask substrate with a first pitch not larger than eight times a wavelength of the irradiation light, has a transmittance of not more than 5% for the irradiation light, and phase-shifts the irradiation light by 180°, and a second phase shifter which is arranged on the mask substrate with a second pitch larger than eight times the wavelength, has a transmittance of not more than 5%, and phase-shifts the irradiation light by 180°.

According to another aspect of the present invention, there is provided a method of manufacturing a semiconductor device comprising forming a resist film on a wafer by coating, irradiating a photomask with irradiation light to transfer an image of a mask pattern including a first phase shifter and a second phase shifter onto the resist film, the first phase shifter being arranged on the mask substrate with a first pitch not more than eight times a wavelength of the irradiation light, having a transmittance of not more than 5% for the irradiation light, and serving to phase-shift the irradiation light by 180°, and the second phase shifter being arranged on the mask substrate with a second pitch larger than eight times the wavelength, having a transmittance of not more than 5%, and serving to phase-shift the irradiation light by 180°, and developing the resist film.

DETAILED DESCRIPTION OF THE INVENTION

Figure 1:
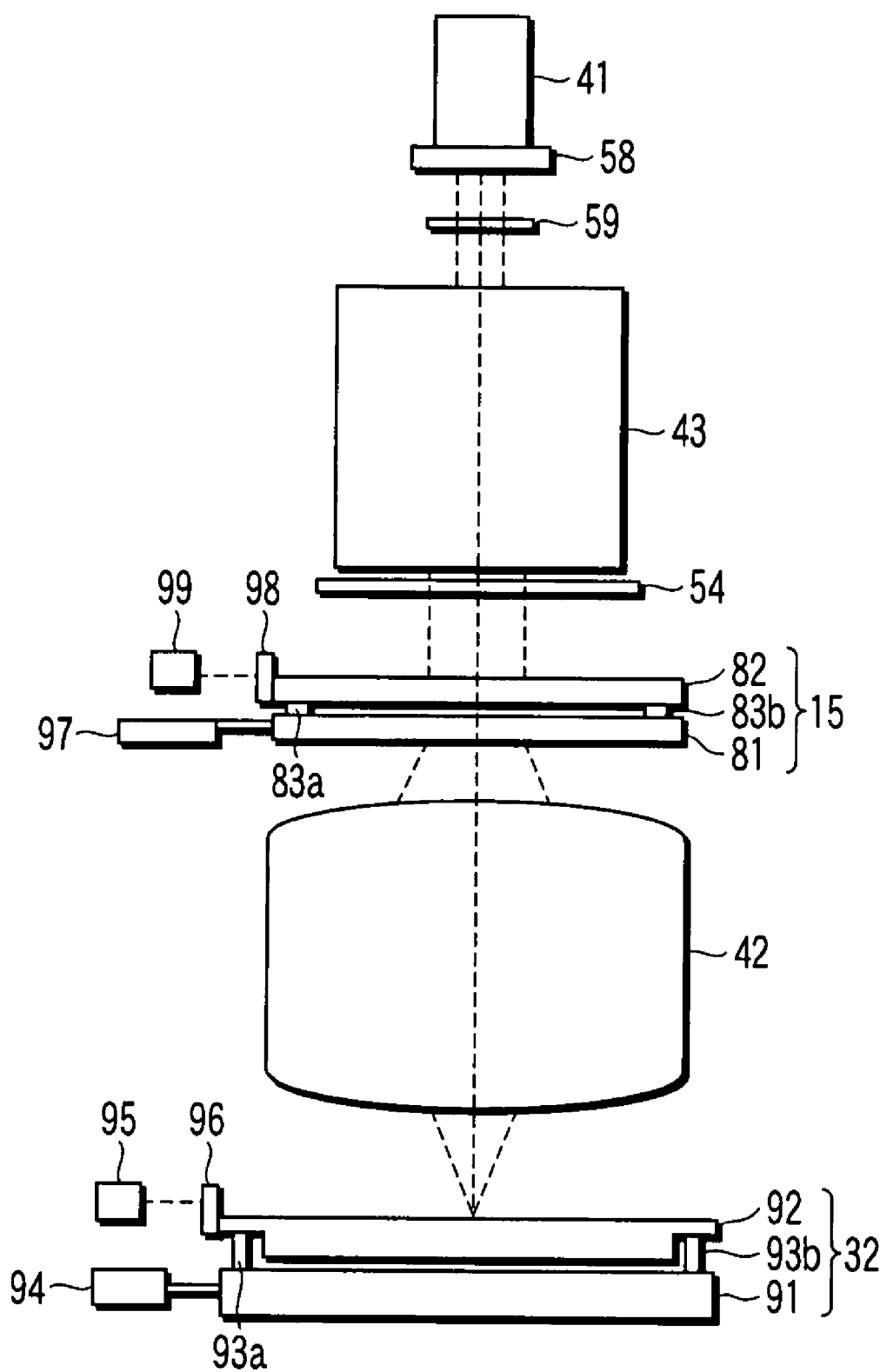
FIG. 1 is a schematic view showing an immersion lithography apparatus which employs a photomask according to an embodiment of the present invention.

The embodiments of the present invention will be described with reference to the accompanying drawing. In the following description of the drawing, the same or similar parts are denoted by the same or similar reference numerals. Note that the following embodiments exemplify an apparatus and a method to embody the technical idea of the invention, and that the technical idea of the invention does not specify the arrangement and the like of the constituent components to that described below. Various changes can be made on the technical idea of the invention within the spirit and scope of the appended claims.

FIG. 1 is a schematic view of an immersion lithography apparatus which employs a photomask according to an embodiment of the present invention. This lithography apparatus comprises an illumination light source 41, an aperture diaphragm holder 58 arranged on the exit side of the illumination light source 41, a polarizer 59 which polarizes irradiation light emitted from the illumination light source 41, a condensing optical system 43 which condenses the irradiation light, a slit holder 54 arranged on the exit side of the condensing optical system 43, a reticle stage 15 arranged under the slit holder 54, a projection optical system 42 arranged under the reticle stage 15, and a wafer stage 32 arranged under the projection optical system 42.

The illumination light source 41 emits irradiation light in the ultraviolet range (1 nm to 400 nm), e.g., an argon fluoride (ArF) laser beam with a wavelength of 193 nm.

Figure 2:
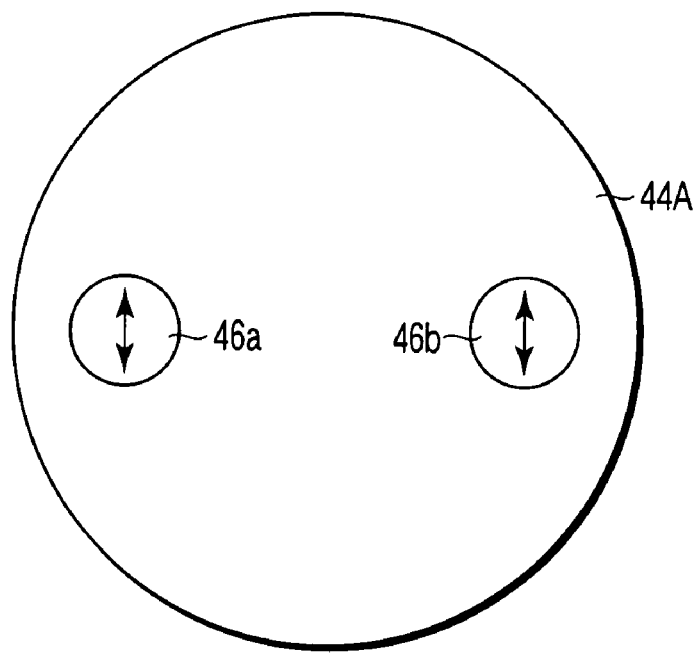
FIG. 2 is a plan view showing an example of a polarizer employed in the immersion lithography apparatus shown in FIG. 1.
Figure 3:
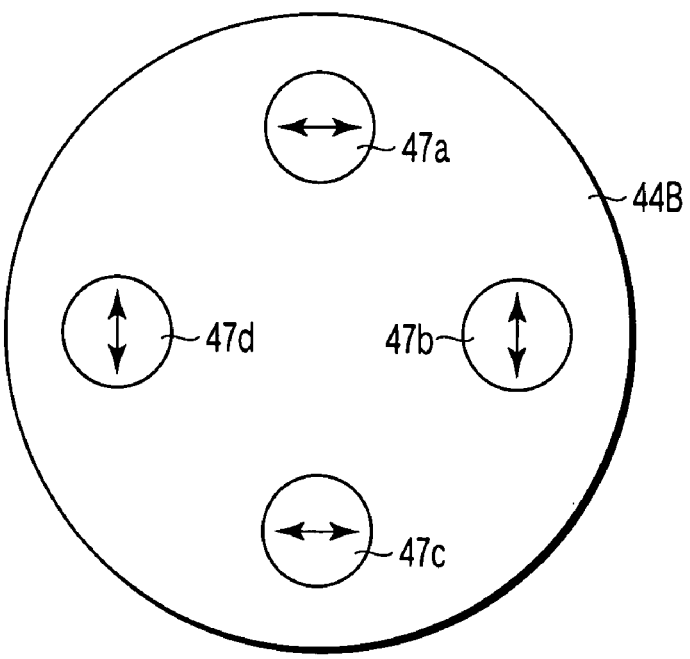
FIG. 3 is a plan view showing another example of the polarizer employed in the immersion lithography apparatus shown in FIG. 1.

As shown in, e.g., FIG. 2, the polarizer 59 has a light-shielding plate 44A and two round polarization windows 46a and 46b formed in the light-shielding plate 44A. The polarization directions of the irradiation light beams respectively transmitted through the polarization windows 46a and 46b are aligned to be parallel to each other with an optical axis between them, as indicated by arrows. Alternatively, as shown in FIG. 3, the polarizer 59 has a light-shielding plate 44B and four round polarization windows 47a, 47b, 47c, and 47d formed in the light-shielding plate 44B. The polarization directions of the irradiation light beams respectively transmitted through the polarization windows 47a, 47b, 47c, and 47d are aligned in the circumferential direction with respect to the optical axis, as indicated by arrows. In this manner, the shape of the polarizer 59 determines the multi-pole illumination such as Dipole illumination or Quadrupole illumination.

Figure 4:
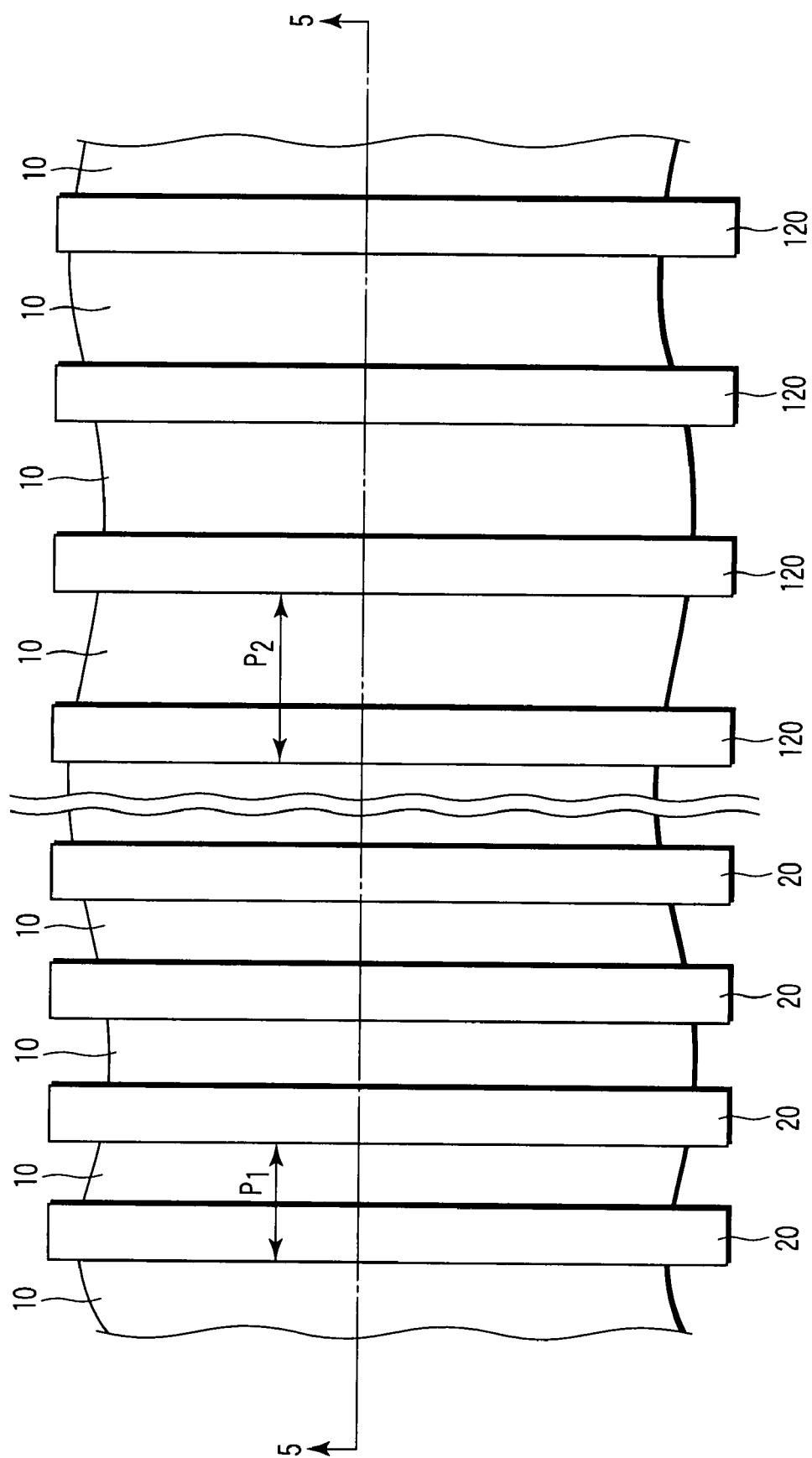
FIG. 4 is a pattern plan view showing a photomask according to the embodiment of the present invention.
Figure 5:
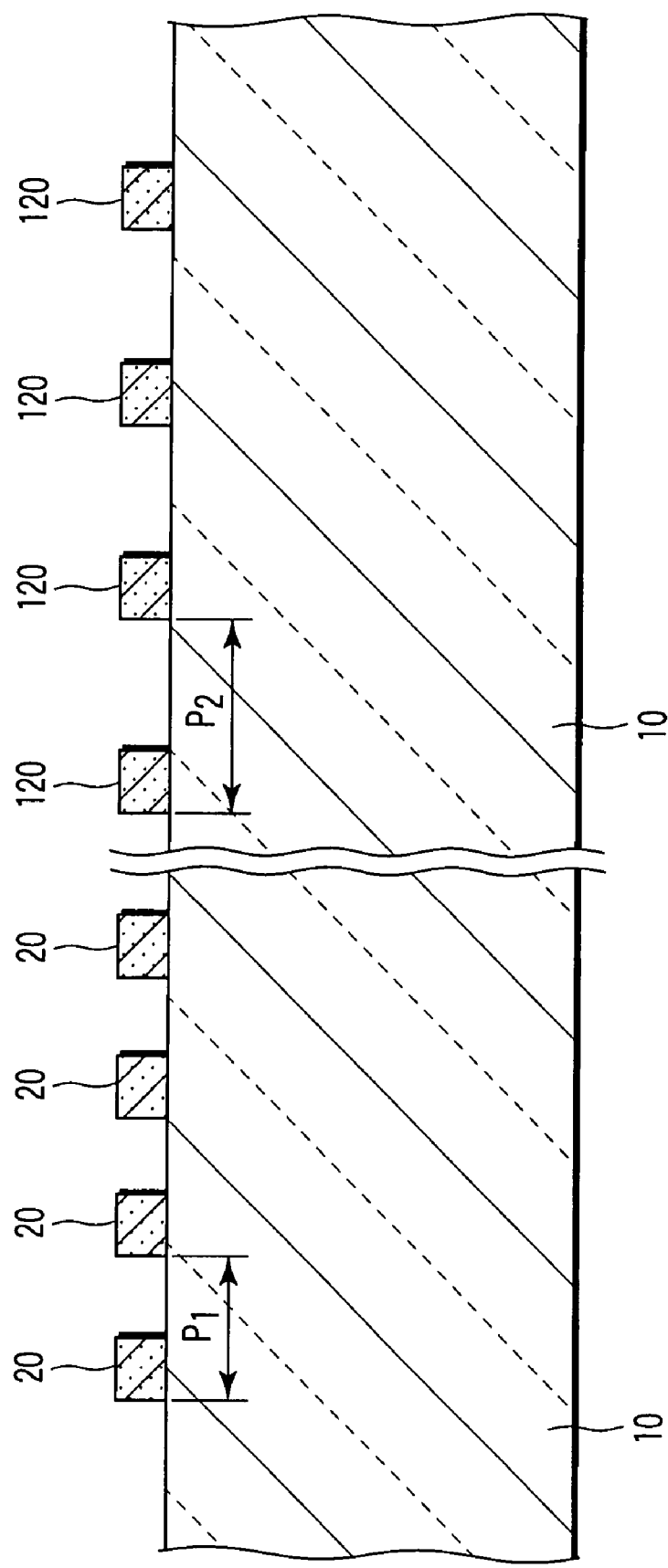
FIG. 5 is a sectional view taken along the line 5-5 of FIG. 4 to show the photomask according to the embodiment of the present invention.

A photomask according to this embodiment is arranged on the reticle stage 15 shown in FIG. 1. The photomask has an arrangement as shown in FIGS. 4 and 5. FIG. 4 is a pattern plan view, and FIG. 5 is a sectional view taken along the line 5-5 of FIG. 4. More specifically, the photomask comprises first phase shifters 20 and second phase shifters 120 on a mask substrate 10 to be irradiated with the irradiation light. The first phase shifters 20 are arranged on the mask substrate 10 with a first pitch P1 which is equal or smaller than eight times the wavelength of the irradiation light, have a transmittance t1 for the irradiation light that falls within a range of 0.016% to 5% (both inclusive, or 0.016%≦t1≦5%), and phase-shift the irradiation light by 180°. The second phase shifters 120 are arranged on the mask substrate 10 with a second pitch P2 which is larger than eight times the wavelength, have a transmittance t2 that falls within the range of 0.016% to 5% (both inclusive, or 0.016%≦t2≦5%), and phase-shift the irradiation light by 180°.

The first phase shifters 20 constitute the light-shielding portion of a mask pattern which corresponds to a circuit pattern, e.g., a transistor, of a semiconductor device. The first pitch P1 may be equal to or less than four times the wavelength, or equal to or less than twice the wavelength. When the wavelength of the irradiation light is 193 nm, the first pitch P1 is 1,544 nm or less. The first pitch P1 may also be 772 nm or less, or 386 nm or less. The lower limit of the first pitch P1 is determined within a range with which the first phase shifters 20 generate 1st-order diffraction light.

The second phase shifters 120 constitute the light-shielding portion of a mask pattern which corresponds to a circuit pattern larger than the transistor, e.g., an input/output port, of a semiconductor device. When the wavelength of the irradiation light is 193 nm, the second pitch P2 is larger than 1,544 nm. An atomic force microscope (AFM), a scanning electron microscope (SEM), or the like can measure each of the first pitch P1 and second pitch P2.

As the material of the transparent mask substrate 10, quartz (SiO$_2$) or the like can be used. The thicknesses of each first phase shifter 20 and of each second phase shifter 120 are, e.g., 70 nm. As the material of the first phase shifters 20 and second phase shifters 120, molybdenum silicide (MoSi) or the like having an extinction coefficient k falling within a range of 0.65 to 0.95 (both inclusive) can be employed. A complex refractive index n* of the material is given by the following equation (1):

$$n^* = n - ik \quad (1)$$

where n is a refractive index and i is an imaginary number.

Even when the composition ratio of molybdenum (Mo) to silicon (Si) as the materials of the first and second phase shifters 20 and 120 is changed, the refractive indices n of the first and second phase shifters 20 and 120 stay almost constant. When, however, changing the composition ratio of Mo to Si, the extinction coefficients k of the first and second phase shifters 20 and 120 change. Thus, adjustment of the composition ratio of Mo to Si can set the extinction coefficients k of the first and second phase shifters 20 and 120 to fall within a range of 0.65 to 0.95. The photomask is arranged on the reticle stage 15 shown in FIG. 1 with its side where the first and second phase shifters 20 and 120 are arranged facing down.

The reticle stage 15 comprises a reticle X-Y stage 81, reticle moving shafts 83a and 83b, and a reticle Z inclined stage 82. The reticle moving shafts 83a and 83b connect the reticle X-Y stage 81 to the reticle Z inclined stage 82. A reticle stage driving unit 97 is connected to the reticle stage 15. The reticle stage driving unit 97 scans the reticle X-Y stage 81 in the horizontal direction, and the reticle moving shafts 83a and 83b in the vertical direction. Thus, the reticle Z inclined stage 82 can be positioned in the horizontal direction by the reticle X-Y stage 81 and arranged to be inclined with respect to the horizontal plane by the reticle moving shafts 83a and 83b. A reticle moving mirror 98 is arranged at the end of the reticle Z inclined stage 82. A reticle laser interferometer 99 arranged to oppose the reticle moving mirror 98 measures the position of the reticle Z inclined stage 82.

The projection optical system 42 has a numerical aperture (NA) of, e.g., 1.2, and a projection magnification of ¼. A wafer on which a resist film is formed by coating and onto which a mask pattern formed on the photomask shown in FIGS. 4 and 5 is to be projected is arranged on the wafer stage 32. The wafer stage 32 comprises a wafer X-Y stage 91, wafer moving shafts 93a and 93b arranged above the wafer X-Y stage 91, and a wafer Z inclined stage 92 which is to be connect to the wafer X-Y stage 91 by the wafer moving shafts 93a and 93b. The wafer stage 32 is connected to a wafer stage driving unit 94. The wafer stage driving unit 94 scans the wafer X-Y stage 91 in the horizontal direction, and the wafer moving shafts 93a and 93b in the vertical direction. Thus, the wafer Z inclined stage 92 can be positioned in the horizontal direction by the wafer X-Y stage 91 and arranged to be inclined with respect to the horizontal plane by the wafer moving shafts 93a and 93b. A wafer moving mirror 96 is arranged at the end of the wafer Z inclined stage 92. A wafer laser interferometer 95 arranged to oppose the wafer moving mirror 96 measures the position of the wafer Z inclined stage 92.

Figure 6:
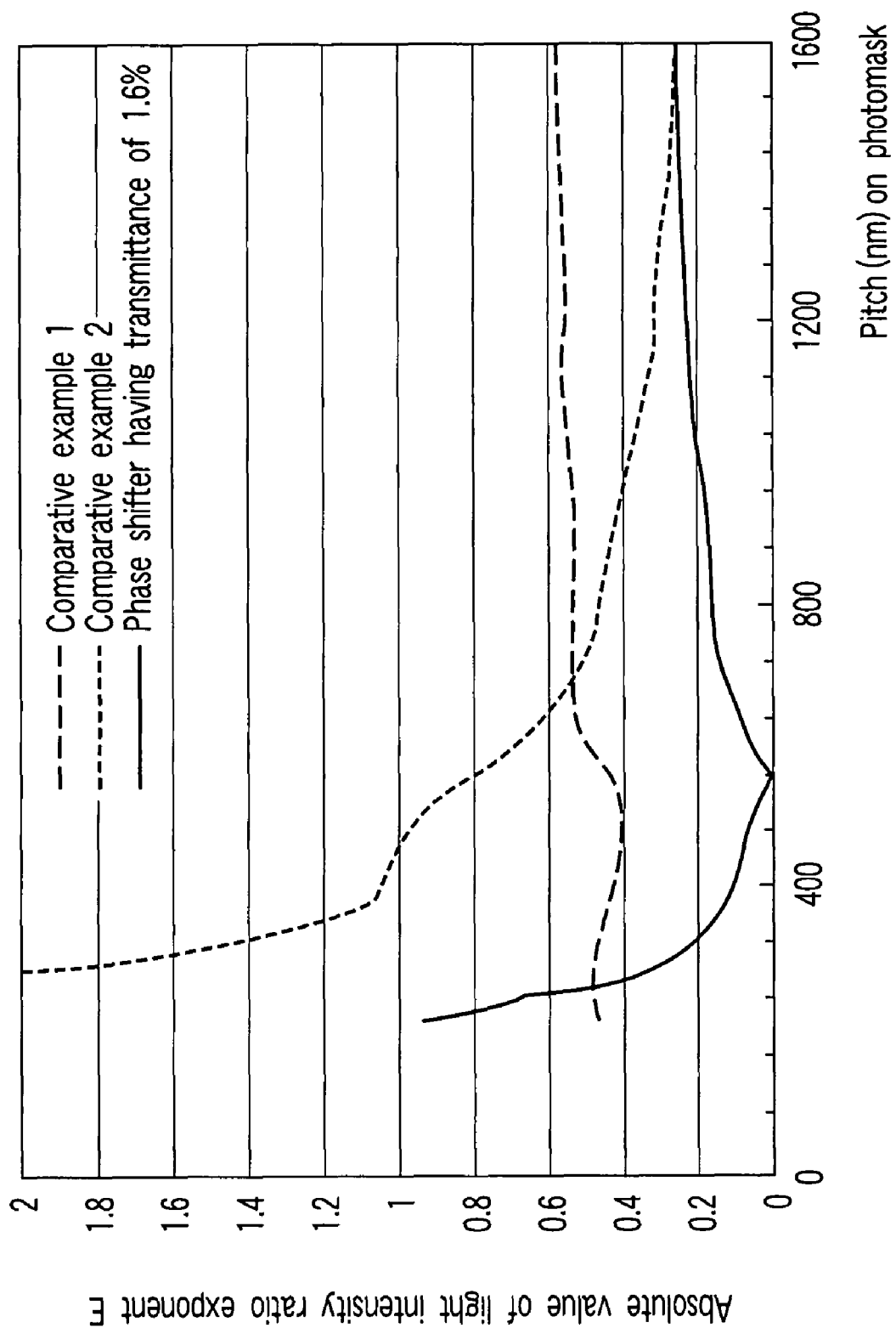
FIG. 6 is a first graph showing the relationship between the pitch of the mask pattern of the photomask shown in FIGS. 4 and 5 and a light intensity ratio exponent.

FIG. 6 is a graph showing the relationship between the pitch of the mask pattern of the photomask and the absolute value of a light intensity ratio exponent E given by the following equation (2):

$$E = (I1/I0) - 1 \quad (2)$$

where I0 is the light intensity of the 0th-order diffracted light generated when irradiating the mask pattern with the irradiation light, and I1 is the light intensity of the 1st-order diffracted light generated when irradiating the mask pattern with the irradiation light. When the 1st-order diffracted light intensity I1 and 0th-order diffracted light intensity I0 are equal, the projection optical system 42 shown in FIG. 1 projects the image of the mask pattern onto the wafer arranged on the wafer stage 32, to form an image there. When the 1st-order diffracted light intensity I1 and 0th-order diffracted light intensity I0 are different, however, the contrast of the projection image of the mask pattern decreases. When the light intensity ratio exponent E is 0, the 1st-order diffracted light intensity I1 and 0th-order diffracted light intensity I0 are equal, and a high-contrast projection image of the mask pattern is formed. In contrast to this, when the difference between the 1st-order diffracted light intensity I1 and 0th-order diffracted light intensity I0 increases, the absolute value of the light intensity ratio exponent E increases. Therefore, the absolute value of the light intensity ratio exponent E is inversely proportional to the contrast to the projection image of the mask pattern. As far as the absolute value of the light intensity ratio exponent E is 0.3 or less, a projection image with a contrast that does not hinder the manufacture of the semiconductor device can be obtained.

Comparative Example 1 in FIG. 6 indicates the light intensity ratio exponent E which is obtained when using a low-reflection chromium two-layered film made of chromium (Cr) and chromium oxide (CrO) to form the light-shielding portion of the mask pattern. When using the low-reflection chromium two-layered film to form the mask pattern, with the pitch of the mask pattern falling within a range of 400 nm to 1,600 nm, the absolute value of the light intensity ratio exponent E is 0.4 to 0.6. When the absolute value of the light intensity ratio exponent E is 0.5, the 0th-order diffracted light intensity I0 is 1.5 times the 1st-order diffracted light intensity I1. This makes the projection image of the mask pattern to have a low contrast.

Comparative Example 2 in FIG. 6 indicates the light intensity ratio exponent E which is obtained when using phase shifters, which phase-shift the irradiation light with a transmittance of 6% and a wavelength of 193 nm by 180°, to form the light-shielding portion of the mask pattern. The material of the phase shifters is MoSi. When using the phase shifters having a transmittance of 6% to form the mask pattern, if the mask pattern has a pitch of 1,600 nm, the light intensity ratio exponent E is 0.25, and a projection image with a contrast that does not hinder the manufacture of the semiconductor device can be obtained. The smaller the pitch, however, the larger the light intensity ratio exponent E becomes due to the waveguide effect. Furthermore, when the pitch is less than 1,360 nm, the light intensity ratio exponent E becomes 0.3 or more. When the pitch further decreases to less than 720 nm, the light intensity ratio exponent E becomes larger than that of the low-reflection chromium two-layered film. When phase shifters having a transmittance of 6% are used to constitute a mask pattern in which a pattern having a pitch of 1,600 nm, which is larger than 8 times the wavelength of the irradiation light, and a pattern having a pitch smaller than 3.7 times the wavelength of the irradiation light are mixed, the contrast of the projection image of the later pattern becomes lower than the contrast to the projection image of the former pattern. This causes a malfunction in the manufactured semiconductor device.

With respect to Comparative Examples 1 and 2, when using phase shifters having a transmittance of 1.6%, which phase-shift the irradiation light having a wavelength of 193 nm by 180°, to form the light-shielding portion of the mask pattern, the light intensity ratio exponent E is 0.25 if the pitch of the mask pattern is 1,600 nm. Note that the polarizer 59 shown in FIG. 2 which forms Dipole illumination s-polarizes the irradiation light. The phase shifters having the transmittance of 1.6% are made of Mo and Si. The smaller the pitch, the smaller the light intensity ratio exponent E, as shown in FIG. 6. When the pitch falls within a range of 320 nm (inclusive) to 1,040 nm (exclusive), the light intensity ratio exponent E becomes 0.2 or less. When phase shifters having a transmittance of 1.6% are used to constitute a mask pattern in which a pattern having a pitch of 1,600 nm, which is larger than 8 times the wavelength of the irradiation light, a pattern having a pitch equal to 4 times or less the wavelength of the irradiation light, and a pattern having a pitch equal to twice or less and equal to 1.6 times or more the wavelength of the irradiation light are mixed, the projection image of the mask pattern can be formed with a high contrast regardless of the value of the pitch. In particular, if the polarizer 59 for Dipole illumination shown in FIG. 2 is used, it forms a projection image with only the 0th-order diffracted light and 1st-order diffracted light. This enhances the effect of improving the contrast of the projection image of the mask pattern.

Figure 7:
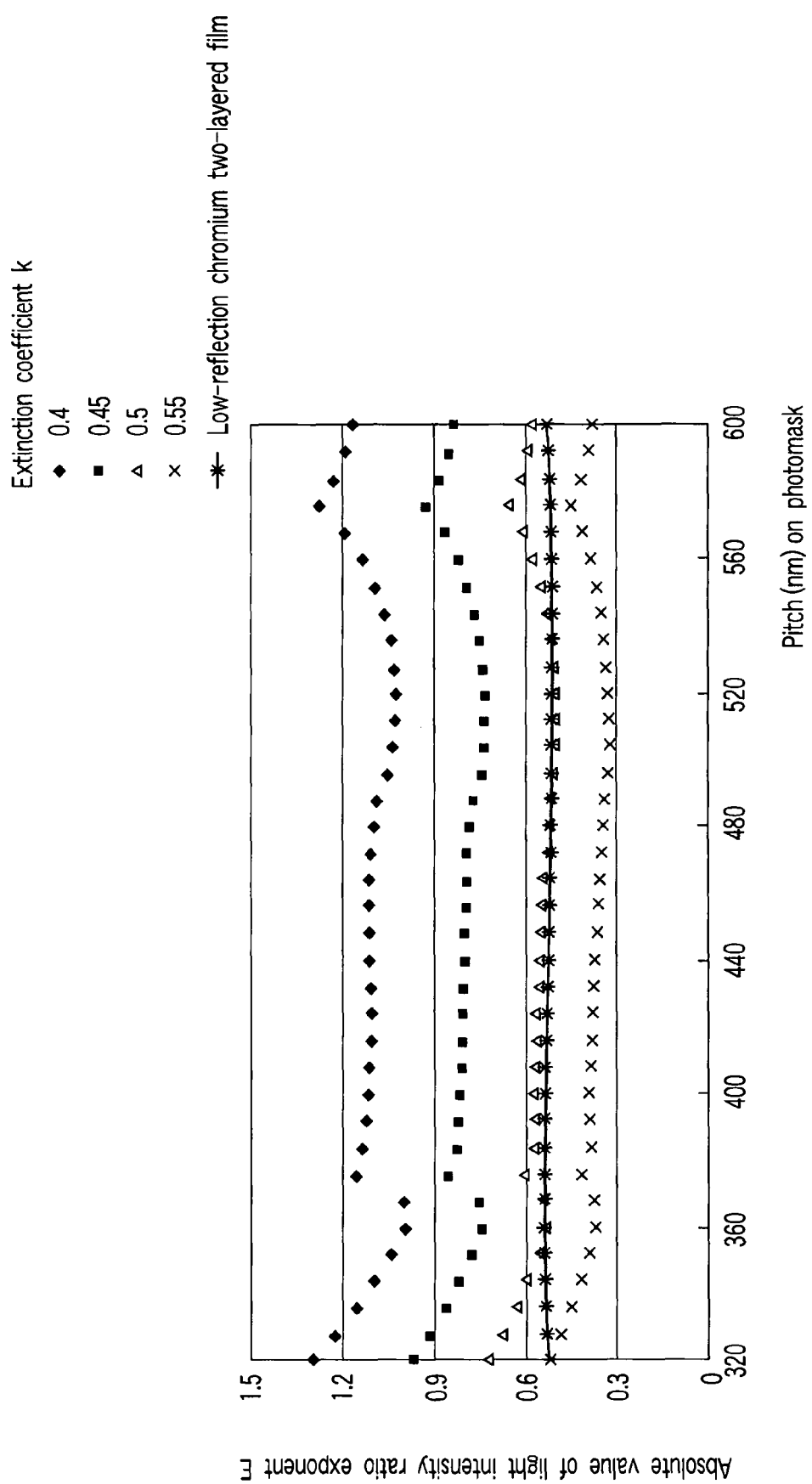
FIG. 7 is a second graph showing the relationship between the pitch of the mask pattern of the photomask shown in FIGS. 4 and 5 and the light intensity ratio exponent.
Figure 8:
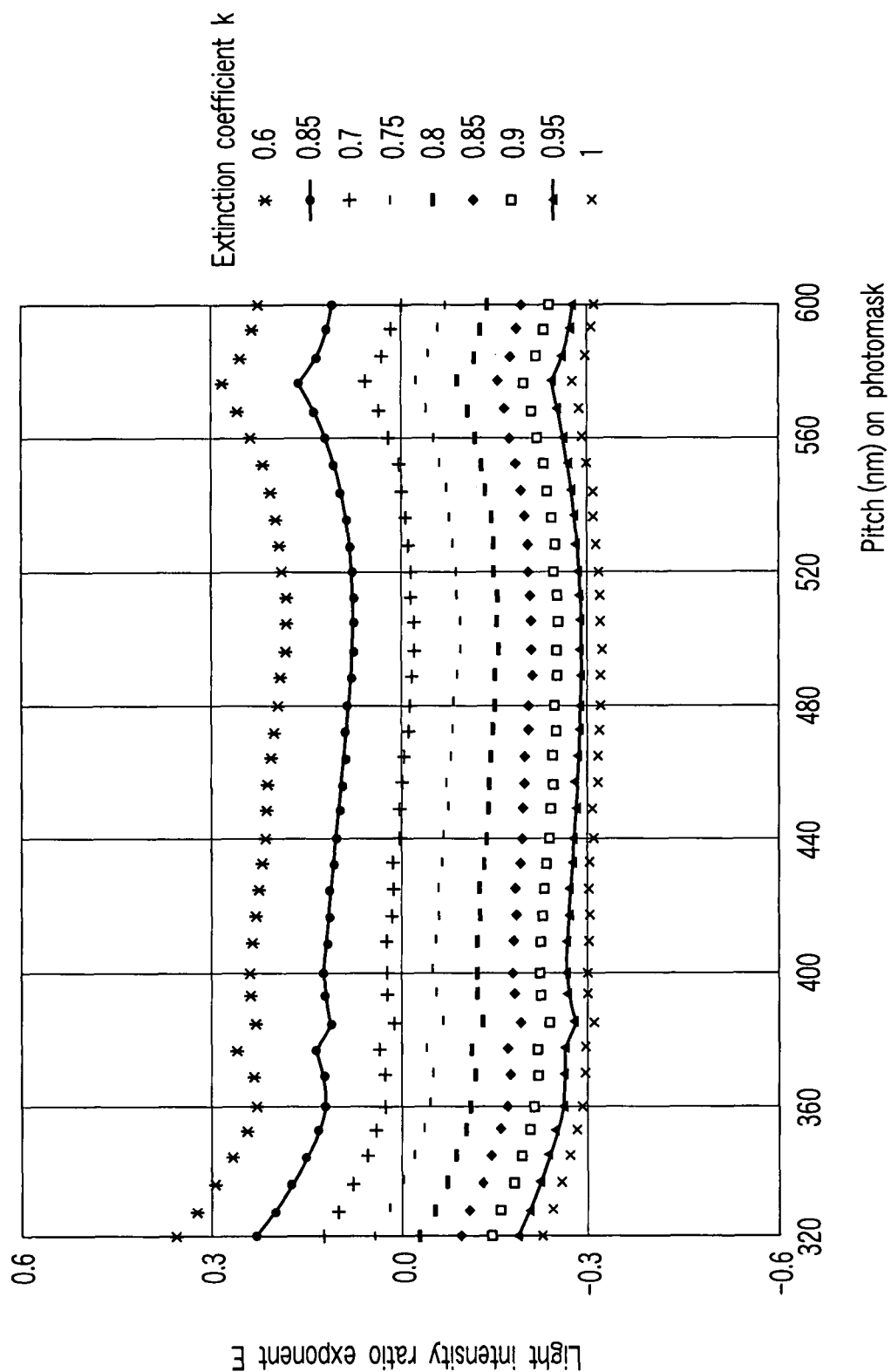
FIG. 8 is a third graph showing the relationship between the pitch of the mask pattern of the photomask shown in FIGS. 4 and 5 and the light intensity ratio exponent.

FIGS. 7 and 8 are graphs each showing the relationship between the pitch of the mask pattern and the light intensity ratio exponent E when changing the extinction coefficient k. As shown in FIG. 7, when using a low-reflection chromium two-layered film to form the light-shielding portion of the mask pattern, when the pitch falls within a range of 320 nm to 600 nm, the light intensity ratio exponent E is 0.5 to 0.6. If the extinction coefficient k of the phase shifters made of Mo and Si, which phase-shift the irradiation light having the wavelength of 193 nm by 180°, is smaller than 0.5, the light intensity ratio exponent E becomes larger than 0.6, and the contrast of the projection image becomes lower than that of the case using the low-reflection chromium two-layered film. When the extinction coefficient k of the phase shifters becomes 0.55, the light intensity ratio exponent E becomes 0.3 to 0.5, and the contrast of the projection image of the mask pattern becomes higher than that of the case using the low-reflection chromium two-layered film.

As shown in FIG. 8, as the extinction coefficient k increases from 0.6, the light intensity ratio exponent E decreases. When the extinction coefficient k becomes 0.6, the light intensity ratio exponent E becomes almost 0.3 or less. When the extinction coefficient k becomes 0.65, the light intensity ratio exponent E becomes almost less than 0.2. Furthermore, when the extinction coefficient k becomes 0.7, the light intensity ratio exponent E becomes almost 0. Therefore, if the extinction coefficient k of the material of the phase shifters is 0.7, the projection image of the mask pattern can be formed without impairing the contrast. When the extinction coefficient k becomes 0.75, the light intensity ratio exponent E becomes −0.1 to 0, and the 1st-order diffracted light intensity I1 and 0th-order diffracted light intensity I0 start to differ from each other again. When the extinction coefficient k becomes 0.85, the light intensity ratio exponent E becomes almost −0.2. When the extinction coefficient k becomes 0.95, the light intensity ratio exponent E becomes almost −0.3. Therefore, as far as the extinction coefficient k falls within a range of 0.65 to 0.95 (both inclusive), even if the pitch is equal to or less than the wavelength, or even equal to or less than half the wavelength, the light intensity ratio exponent E falls within a range of −0.3 to 0.3 (both inclusive). Hence, the projection image of a mask pattern with a contrast that does not hinder the manufacture of the semiconductor device can be formed. When the extinction coefficient k becomes 1 or more, the light intensity ratio exponent E becomes less than −0.3, and the contrast of the projection image of the mask pattern decreases again. When the extinction coefficient k falls within a range of 0.65 to 0.95 (both inclusive), the transmittance of the phase shifters falls within a range of 0.016% to 5% (both inclusive).

Therefore, when using a material having a transmittance falling within a range of 0.016% to 5% (both inclusive) is used to form the first and second phase shifters 20 and 120 shown in FIGS. 4 and 5, both the projection image of a pattern formed of the second phase shifters 120, which are arranged with the second pitch P2 larger than 8 times the wavelength of the irradiation light, and the projection image of a pattern formed of the first phase shifters 20, which are arranged with the first pitch P1 equal to or less than 8 times the wavelength of the irradiation light, can be formed to have a high contrast. Furthermore, even if the first pitch P1 is equal or less than the wavelength, or even equal to or less than half the wavelength, the projection image of the mask pattern can be formed to have a high contrast. Hence, by using a photomask according to the embodiment, semiconductor devices having circuit patterns with different sizes can be manufactured highly accurately. As the first and second phase shifters 20 and 120 can be made from one material, the photomask according to the embodiment can be manufactured at a low cost.

Figure 9:
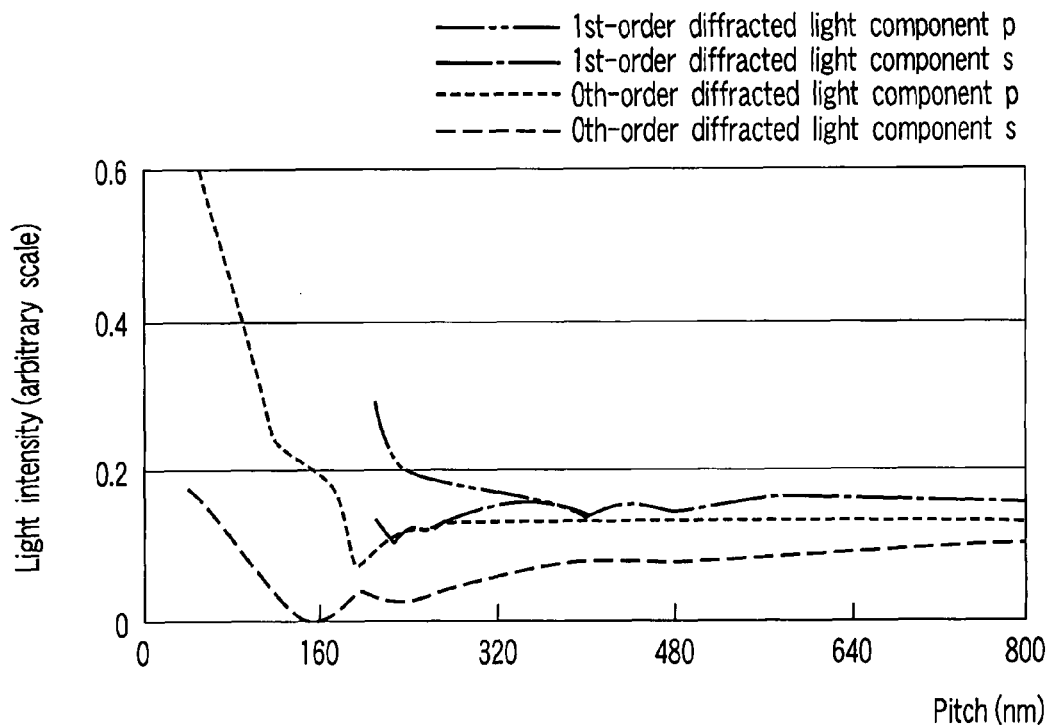
FIG. 9 is a graph showing the relationship between the pitches of mask patterns according to the comparative examples of the embodiment of the present invention and a light intensity.

FIG. 9 is a graph showing the relationship between the pitch on the photomask of the mask pattern and the diffracted light intensity when using conventional phase shifters having a transmittance of 6%, which phase-shift the irradiation light having a wavelength of 193 nm by 180°, to form the light-shielding portion of the mask pattern. When the pitch is equal to or more than 386 nm, which is twice the wavelength of the irradiation light, the light intensity of a 1st-order diffracted light component p and that of a 1st-order diffracted light component s are almost equal to each other. When, however, the pitch becomes less than 386 nm, the two light intensities start to diverge from each other due to the waveguide effect. The light intensity of a 0th-order diffracted light component p and that of a 0th-order diffracted light component s diverge from each other when the pitch is equal to or more than 386 nm as well. Furthermore, when the pitch becomes less than 386 nm, the light intensities start to further diverge from each other due to the waveguide effect. The difference between the 0th-order diffracted light intensity and the 1st-order diffracted light intensity is large even when the pitch is about twice to four times the wavelength, thus decreasing the contrast of the projection image. In contrast to this, when using the photomask shown in FIGS. 4 and 5, the difference between the 0th-order diffracted light intensity and the 1st-order diffracted light intensity decreases. Thus, the problem of the waveguide effect does not arise.

Figure 10:
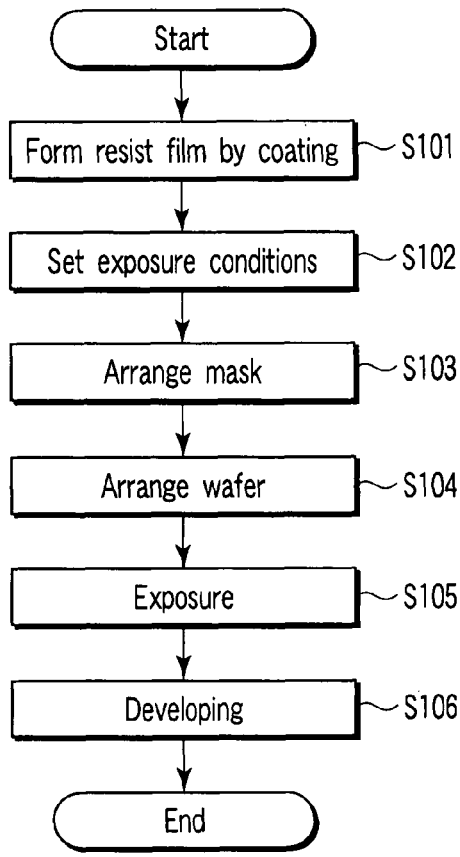
FIG. 10 is a flowchart showing a method of manufacturing semiconductor device according to an embodiment of the present invention.

A semiconductor device manufacturing method according to an embodiment of the present invention will be described with reference to the flowchart shown in FIG. 10.

(a) In step S101, a silicon (Si) wafer is prepared, and a resist film is formed on the Si wafer by spin coating. In step S102, the polarizer 59 for Dipole illumination shown in FIG. 2 is arranged in the lithography apparatus shown in FIG. 1, and set such that it emits s-polarized irradiation light toward the condensing optical system 43. In step S103, the photomask shown in FIGS. 4 and 5 is arranged on the reticle stage 15 shown in FIG. 1. In step S104, the Si wafer formed with the resist film by coating is arranged on the wafer stage 32.

(b) In subsequent step S105, the illumination light source 41 emits irradiation light. The polarizer 59 s-polarizes the irradiation light. The irradiation light passes through the condensing optical system 43 to irradiate the photomask arranged on the reticle stage 15. The projection optical system 42 transfers the image of the mask pattern, formed of the first phase shifters 20 and second phase shifters 120 shown in FIGS. 4 and 5, onto the surface of the resist film on the Si wafer. In step S106, the resist film is developed to form a pattern corresponding to the mask pattern on the Si wafer. After that, ion implantation, formation of an insulating film, formation of interconnections, and the like are performed to complete a semiconductor device.

With the semiconductor device manufacturing method according to the embodiment of the present invention described above, as the photomask shown in FIGS. 4 and 5 is used, semiconductor devices having circuit patterns with different sizes can be manufactured highly accurately.

OTHER EMBODIMENTS

Although the embodiments of the present invention are described above, the description and drawing that form part of the disclosure should not be understood to limit the invention. Various alternative aspects, embodiments, and practicing skills will become apparent to those skilled in the art from this disclosure. For example, in the above embodiment, MoSi is employed as the material of each of the first phase shifters 20 and second phase shifters 120 shown in FIGS. 4 and 5. However, any material can be employed to form the first phase shifters 20 and second phase shifters 120 as far as the phase shifters are to phase-shift the irradiation light by 180° and have a transmittance of 5% or less.

As described above, according to one aspect of this invention, a photomask which can decrease the waveguide effect, and a semiconductor device manufacturing method which uses this photomask are provided.

What is claimed is:

1. A photomask comprising:
   a mask substrate to be irradiated with irradiation light;
   a first phase shifter comprising three or more first type phase shift elements, wherein the three or more first type phase shift elements are arranged on the mask substrate with a first pitch not larger than eight times a wavelength of the irradiation light, and wherein the first phase shifter has a transmittance of not more than 5% for the irradiation light and phase-shifts the irradiation light by 180°; and
   a second phase shifter comprising three or more second type phase shift elements, wherein the three or more second type phase shift elements are arranged on the mask substrate with a second pitch larger than eight times the wavelength of the irradiation light, and wherein the second phase shifter has a transmittance of not more than 5%, and phase-shifts the irradiation light by 180°.

2. The photomask according to claim 1, wherein each of the first phase shifter and the second phase shifter contains molybdenum silicide.

3. The photomask according to claim 1, wherein each of the first phase shifter and the second phase shifter has an extinction coefficient k falling within a range of $0.65 \leq k \leq 0.85$.

4. The photomask according to claim 1, wherein the first phase shifter and the second phase shifter have the same transmittance.

5. The photomask according to claim 1, wherein each of the first phase shifter and the second phase shifter has a transmittance t that preferably falls within a range of $0.016\% \leq t \leq 5\%$.

6. The photomask according to claim 1, wherein the irradiation light which irradiates the mask substrate has polarization directions that are aligned to be parallel to each other with an optical axis therebetween.

7. The photomask according to claim 1, wherein the irradiation light which irradiates the mask substrate has polarization directions that are aligned in a circumferential direction with respect to an optical axis.

8. The photomask according to claim 1, wherein the first pitch has a lower limit that is determined within a range with which the first phase shifter generates 1st-order diffraction light.

9. A method of manufacturing a semiconductor device comprising:
   forming a resist film on a wafer by coating;
   irradiating a photomask with irradiation light to transfer an image of a mask pattern including a first phase shifter and a second phase shifter onto the resist film, the first phase shifter comprising three or more first type phase shift elements which are arranged on the mask substrate with a first pitch not larger than eight times a wavelength of the irradiation light, having a transmittance of not more than 5% for the irradiation light, and serving to phase-shift the irradiation light by 180°, and the second phase shifter comprising three or more second type phase shift elements which are arranged on the mask substrate with a second pitch larger than eight times the wavelength of the irradiation light, having a transmittance of not more than 5%, and serving to phase-shift the irradiation light by 180°; and developing the resist film.

10. The method according to claim 9, wherein each of the first phase shifter and the second phase shifter contains molybdenum silicide.

11. The method according to claim 9, wherein each of the first phase shifter and the second phase shifter has an extinction coefficient k falling within a range of $0.65 \leq k \leq 0.85$.

12. The method according to claim 9, wherein the first phase shifter and the second phase shifter have the same transmittance.

13. The method according to claim 9, wherein each of the first phase shifter and the second phase shifter has a transmittance t that preferably falls within a range of $0.016\% \leq t \leq 5\%$.

14. The method according to claim 9, wherein the irradiation light is emitted from multipole illumination.

15. The method according to claim 14, wherein the irradiation light has polarization directions that are aligned to be parallel to each other with an optical axis therebetween.

16. The method according to claim 14, wherein the irradiation light has polarization directions that are aligned in a circumferential direction with respect to an optical axis.

17. The method according to claim 9, wherein the first pitch has a lower limit that is determined within a range with which the first phase shifter generates 1st-order diffraction light.

* * * * *